(12) United States Patent
Goto (10) Patent No.: US 9,728,869 B2
(45) Date of Patent: Aug. 8, 2017

(54) PRINTED SUBSTRATE AND PRINTED SUBSTRATE WITH TERMINAL USING SAME

(71) Applicant: Sumitomo Wiring Systems, Ltd, Suzuka (JP)

(72) Inventor: Hideki Goto, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/124,519

(22) PCT Filed: Feb. 25, 2015

(86) PCT No.: PCT/JP2015/055390
§ 371 (c)(1),
(2) Date: Sep. 8, 2016

(87) PCT Pub. No.: WO2015/137120
PCT Pub. Date: Sep. 17, 2015

(65) Prior Publication Data
US 2017/0085015 A1  Mar. 23, 2017

(30) Foreign Application Priority Data
Mar. 14, 2014  (JP) .................................. 2014-052559

(51) Int. Cl.
*H01R 12/00* (2006.01)
*H01R 12/58* (2011.01)
(Continued)

(52) U.S. Cl.
CPC ............. *H01R 12/58* (2013.01); *H05K 1/115* (2013.01); *H05K 1/116* (2013.01); *H05K 3/3447* (2013.01);
(Continued)

(58) Field of Classification Search
CPC ...... H01R 9/092; H01R 12/585; H01R 9/096; H01R 3/7073
(Continued)

(56) References Cited

U.S. PATENT DOCUMENTS 3,328,749 A * 6/1967 Kukla ...................... H01R 9/16
439/389
4,066,326 A * 1/1978 Lovendusky .......... B42D 17/00
439/751

FOREIGN PATENT DOCUMENTS

JP  08148205 A  6/1996
JP  2000100508 A  4/2000
(Continued)

*Primary Examiner* — Phuong T Nguyen
(74) *Attorney, Agent, or Firm* — Dinsmore & Shohl LLP (57) ABSTRACT

The present invention provides a printed substrate having a novel structure in which substrate terminals can be fixed to the printed substrate without needing a base, and the substrate terminals can be press-fitted into through-holes without applying pressing force to printed wiring and a plating layer in the through-holes, and also provides a printed substrate with terminals that uses this printed substrate. A printed substrate includes through-holes into which the first end portions of substrate terminals are to be inserted. The through-holes each include press-fitting regions into which the first end portion of a substrate terminal is to be press-fitted, and conduction regions arranged so as to oppose the outer circumferential surfaces of the first end portion of the substrate terminal via gaps in directions perpendicular to the axis. Printed wiring is connected to the conduction regions, and a plating layer is adhered to the conduction regions.

7 Claims, 7 Drawing Sheets

(51) Int. Cl.
  *H05K 1/11* (2006.01)
  *H05K 3/34* (2006.01)
(52) U.S. Cl.
  CPC .............. *H05K 2201/09854* (2013.01); *H05K 2201/1081* (2013.01); *H05K 2201/10303* (2013.01); *H05K 2201/10787* (2013.01); *H05K 2201/10818* (2013.01)
(58) Field of Classification Search
  USPC ............................... 439/82, 943, 751, 65, 80
  See application file for complete search history.

(56) References Cited

FOREIGN PATENT DOCUMENTS

| | | | |
|---|---|---|---|
| JP | 2003338333 A | 11/2003 | |
| JP | 2008035669 A | 2/2008 | |

\* cited by examiner

PRINTED SUBSTRATE AND PRINTED SUBSTRATE WITH TERMINAL USING SAME

CROSS-REFERENCE TO RELATED APPLICATIONS

This application is the U.S. national phase of PCT/JP2015/055390 filed Feb. 25, 2015, which claims priority to Japanese Patent Application JP 2014-052559 filed Mar. 14, 2014.

FIELD OF THE INVENTION

The present invention relates to a printed substrate, and to a printed substrate with terminals in which substrate terminals are provided upright by insertion of first end portions thereof into through-holes of the printed substrate of the present invention.

BACKGROUND OF THE INVENTION

Conventionally, in order to allow a printed substrate for use in an electrical connection box of an automobile or the like to be connected to an external electrical component, a substrate with terminals has been provided in which multiple substrate terminals, which are provided upright, are connected to printed wiring of a printed substrate by inserting first end portions of the substrate terminals into through-holes provided in the printed substrate and then performing soldering.

Incidentally, in order to hold the substrate terminals in an upright state on the printed substrate, the substrate terminals are held in a state of passing through a base made of a synthetic resin, thus positioning and holding the substrate terminals on the printed substrate via the base, as shown in JP 2008-35669A, for example.

However, with this conventional structure, a separate component, namely the base, needs to be prepared, and the operation of press-fitting the substrate terminals into clearance holes of the base needs to be performed, thus having a problem in that an increase in the number of components and an increase in cost cannot be avoided. There is also a problem in that solder cracks are readily formed due to a difference between the linear expansion coefficients of the base and the printed substrate.

Also, as shown in JP 2003-338333A, there has been a proposal to both connect substrate terminals to a printed wiring and hold the substrate terminals in an upright state on the printed substrate by press-fitting first end portions of substrate terminals into through-holes of a printed substrate without using a base.

However, with the method of press-fitting first end portions of the substrate terminals into through-holes, it is not possible to avoid cases where a plating layer in the through-holes becomes detached during press-fitting of the substrate terminals, and the printed wiring, which is made up of copper foil or the like provided in an inner layer of the printed substrate, undergoes deformation due to pressing force during press-fitting of the terminals. Also, due to pressing force that is applied to the printed wiring (inner-layer copper foil) and the like in an inner layer during press-fitting, so-called measling occurs in which glass fibers become detached due to thermal stress in a subsequent soldering step or the like, and this has the possibility of leading to a circuit failure in the printed substrate with terminals. As a result, this has brought about the problem of degradation in the product accuracy of the printed substrate with terminals.

The present invention has been achieved in light of the above-described situation, and a problem to be solved by the present invention is the provision of a printed substrate having a novel structure in which substrate terminals can be fixed to the printed substrate without needing a base, and the substrate terminals can be press-fitted into through-holes with a reduced amount of pressing force applied to printed wiring and a plating layer in the through-holes, and also the provision of a printed substrate with terminals that uses the same printed substrate.

SUMMARY

A first aspect of the present invention related to a printed substrate is a printed substrate including a through-hole into which a first end portion of a substrate terminal is to be inserted, the through-hole including press-fitting regions into which the first end portion of the substrate terminal is press-fitted, and conduction regions arranged so as to oppose outer circumferential surfaces of the first end portion of the substrate terminal via gaps in directions perpendicular to the axis, and printed wiring being connected to the conduction regions, and a plating layer being adhered to the conduction regions, wherein in the through-hole, the conduction regions protrude outward in the directions perpendicular to the axis relative to the press-fitting regions.

According to the printed substrate of this aspect, the through-hole is provided with the press-fitting regions into which the substrate terminal is press-fitted and the conduction regions that oppose the substrate terminal via gaps, and the conduction regions are provided with printed wiring and the plating layer. Accordingly, a function of press-fitting and fixing the substrate terminal to the printed substrate can be realized with merely the press-fitting regions, and this function can be separated from the conduction regions. Accordingly, even in a state where the substrate terminal is press-fitted and fixed to the printed substrate, a situation in which pressing force exerted during press-fitting of the substrate terminal is applied to the printed wiring and the plating layer provided in the conduction regions is avoided. Accordingly, detachment of the plating layer and deformation of the printed wiring in an inner layer (inner-layer copper foil) can be prevented, and, even if a step of soldering to the through-hole is performed thereafter, it is possible to advantageously prevent the occurrence of measling and the occurrence of solder lifting defects caused by plating detachment. Furthermore, in this aspect, the conduction regions bulge outward in the direction perpendicular to the axis relative to the press-fitting regions, thus making it possible to ensure a larger opposing surface distance between the outer circumferential surfaces of the substrate terminal fitted into the through-hole and the conduction regions of the through-hole. As a result, it is possible to stably ensure insertion regions for the solder when soldering the substrate terminal to the through-hole, and it is possible to realize an improvement in a solder lifting property and a resulting improvement in connection stability.

Moreover, by press-fitting the first end portion of the substrate terminal into the press-fitting regions of the through-hole, the substrate terminal can be positioned and held in an upright state on the printed substrate, thus making it possible to eliminate the need for a conventional base. Accordingly, it is possible to reduce the number of components and number of manufacturing steps, and also manufacturing cost. Moreover, eliminating the base, eliminates the formation of solder cracks, thus making it possible to also improve connection reliability between the printed substrate and the substrate terminal.

Note that the printed wiring connected to the conduction regions includes printed substrate provided both as an inner layer and an outer layer. In particular, in the case where the printed wiring is provided as an inner layer, measling prevention can be advantageously achieved.

A second aspect of the present invention related to a printed substrate is the printed substrate according to the first aspect, wherein the press-fitting regions are provided at at least three locations that are separated from each other in a circumferential direction of the through-hole, and the conduction regions are respectively provided between pairs of press-fitting regions that are adjacent in the circumferential direction.

According to this aspect, the press-fitting regions are provided at at least three locations that are separated in the circumferential direction, thus making it possible for the substrate terminal to be press-fitted into and held on the printed substrate in a stable manner, and making it possible to improve precision regarding terminal alignment and rolling. Moreover, the conduction regions are respectively provided between pairs of adjacent press-fitting regions, thus making it possible to put the substrate terminal into conduction with the plating layer of the through-hole by soldering with stability in the circumferential direction.

Note that by providing the press-fitting regions at four locations that are separated with an equal pitch in the circumferential direction, the corner portions of an existing substrate terminal having a square cross-section can be press-fitted and held in a stable manner. Also, a configuration is possible in which by changing the pitch of the four locations, the corner portions of an existing substrate terminal having a rectangular cross-section can be press-fitted and held in a stable manner.

A first aspect of the present invention related to a printed substrate with terminals is a printed substrate with terminals in which a substrate terminal is provided upright by a first end portion thereof being inserted into a through-hole of a printed substrate, the printed substrate according to the first or second aspect being used as the printed substrate, the first end portion of the substrate terminal being press-fitted into the press-fitting regions of the through-hole, and corner portions of the first end portion being pressure welded to the press-fitting regions, and outer circumferential surfaces of the first end portion of the substrate terminal being arranged so as to oppose the conduction regions of the through-hole via gaps in directions perpendicular to the axis, and the substrate terminal and the printed wiring being put into conduction by filling the gaps with solder, wherein in the through-hole, the conduction regions protrude outward in the directions perpendicular to the axis relative to the press-fitting regions.

According to the printed substrate with terminals of this aspect, the printed substrate according to the first or second aspect of the present invention related to a printed substrate is used, and therefore all of the effects described in the first or second aspect of the present invention related to a printed substrate are effectively exhibited when the first end portion of the substrate terminal is press-fitted into and fixed to the through-hole of the printed substrate and then soldered.

A second aspect of the present invention related to a printed substrate with terminals is the printed substrate with terminals according to the first aspect, wherein the press-fitting regions are provided at three locations that are separated from each other in a circumferential direction of the through-hole, and the conduction regions are respectively provided between pairs of press-fitting regions that are adjacent in the circumferential direction, and the first end portion of the substrate terminal has a triangular cross-sectional shape, and three corner portions of the first end portion of the substrate terminal are pressure welded to the press-fitting regions.

According to this aspect, the first end portion of the substrate terminal has a triangular cross-sectional shape, and the three corner portions are pressure welded to the press-fitting regions separated from each other in the circumferential direction. Accordingly, the substrate terminal is press-fitted into and fixed to the through-hole in a stable manner. Moreover, due to the first end portion of the substrate terminal having a triangular cross-sectional shape, the dimension, in the direction perpendicular to the axis, of the gaps between the conduction regions of the through-hole and the outer circumferential surfaces of the first end portion of the substrate terminal that face the conduction regions can be set larger than in the case of a terminal whose cross-sectional shape has four or more sides. Accordingly, without causing the conduction regions of the through-hole to bulge outward in directions perpendicular to the axis, it is possible to ensure a sufficient gap dimension, and an improvement in the solder lifting property can be ensured with the cross-sectional shape of the small through-hole.

A third aspect of the present invention related to a printed substrate with terminals is the printed substrate with terminals according to the first or second aspect, wherein the substrate terminal is provided with an abutting portion that positions the first end portion in an axial direction of the through-hole by abutting against the printed substrate.

According to this aspect, the abutting portion of the substrate terminal abuts against the upper surface of the printed substrate, thus making it possible to position the substrate terminal in the axial direction of the through-hole. Accordingly, it is possible to further position and hold the substrate terminal stably on the printed substrate.

According to the present invention, the through-hole is provided with the press-fitting regions into which the substrate terminal is press-fitted and the conduction regions that oppose the substrate terminal via gaps, and the conduction regions are provided with printed wiring and the plating layer. Accordingly, even in a state where the substrate terminal is press-fitted and fixed to the printed substrate, a situation in which pressing force exerted during press-fitting of the substrate terminal is applied to the printed wiring and the plating layer provided in the conduction regions is avoided, thus making it possible to prevent detachment of the plating layer and deformation of the printed wiring in an inner layer, and making it possible to advantageously avoid the occurrence of measling and the occurrence of solder lifting defects caused by plating detachment. Moreover, given that the substrate terminal can be positioned and held in an upright state on the printed substrate, it is possible to eliminate the need for a conventional base, thus making it possible to reduce the number of components and number of manufacturing steps, and also manufacturing cost. Moreover, eliminating the use of a base, also eliminates the formation of solder cracks, thus making it possible to also improve connection reliability between the printed substrate and the substrate terminal.

DETAILED DESCRIPTION

Hereinafter, embodiments of the present invention will be described with reference to the drawings.

Figure 1:
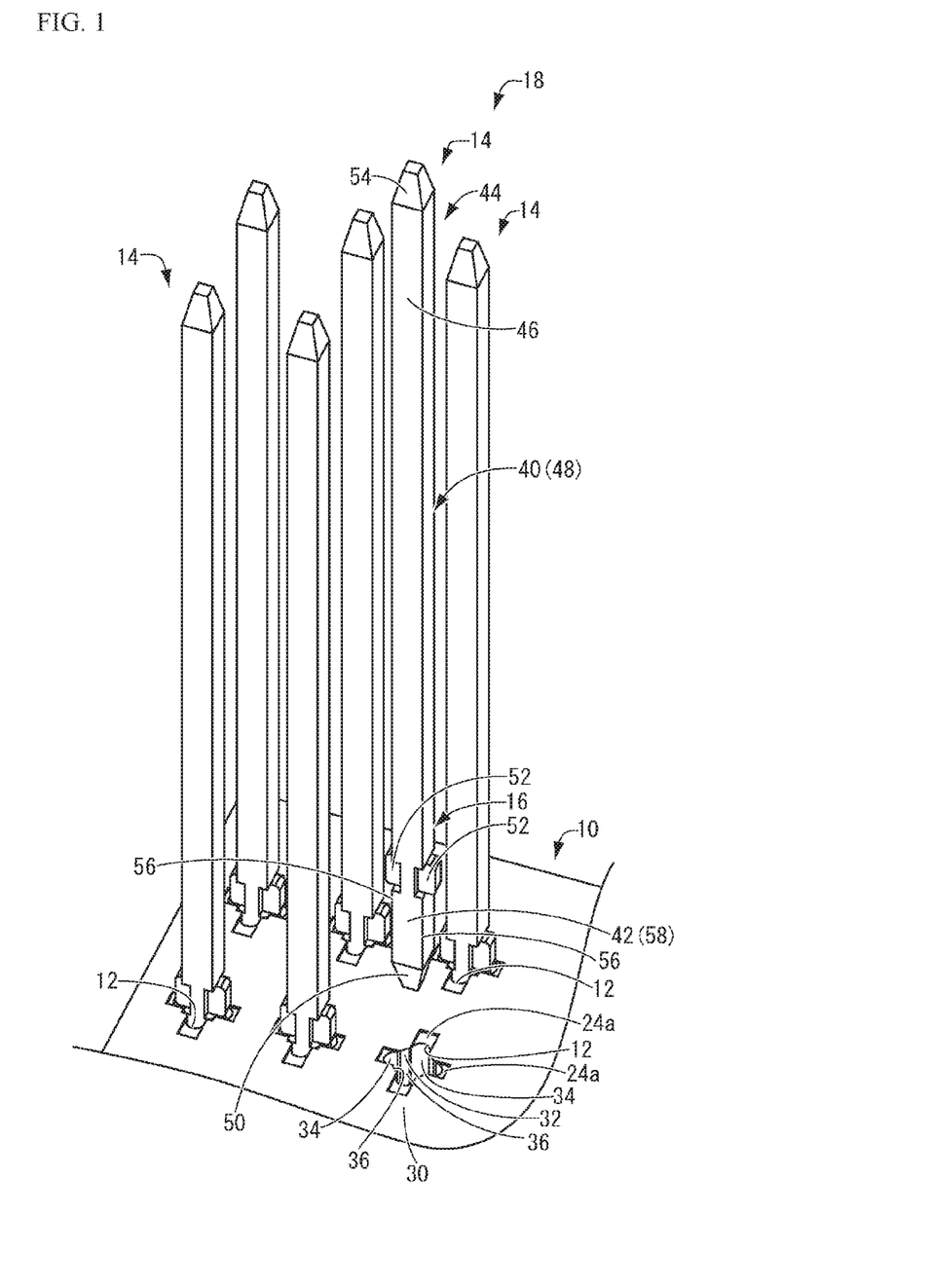
FIG. 1 is a perspective diagram showing a printed substrate serving as a first embodiment of the present invention, and a printed substrate with terminals in which substrate terminals are provided upright on the printed substrate.
Figure 2:
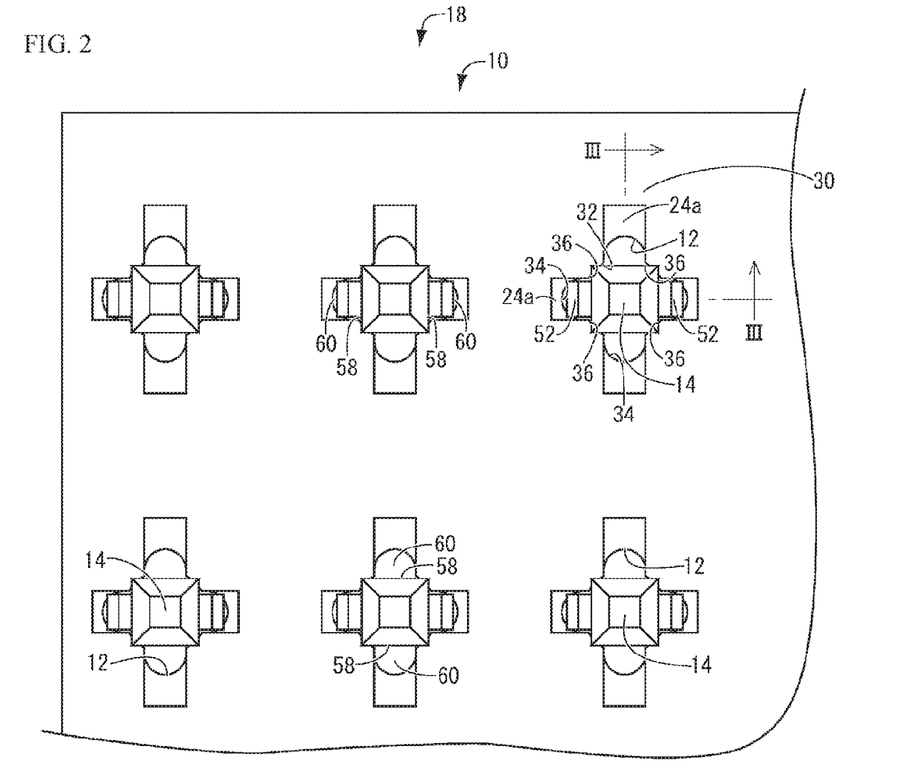
FIG. 2 is a plan view of the printed substrate with terminals shown in FIG. 1.
Figure 3:
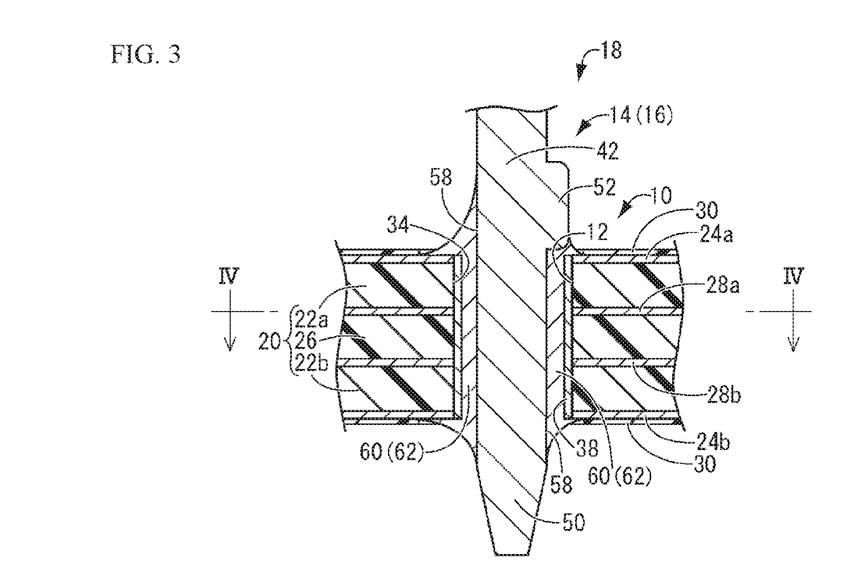
FIG. 3 is a cross-sectional view taken along III-III in FIG. 2.
Figure 4:
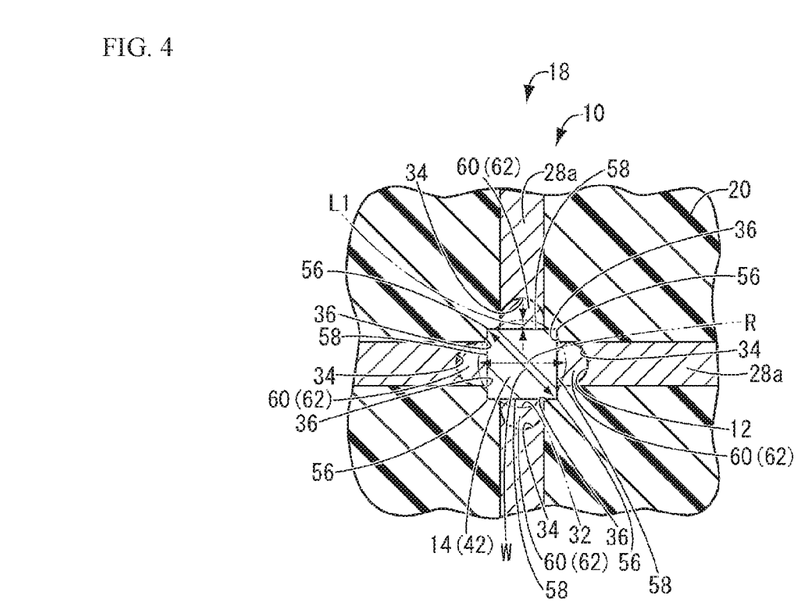
FIG. 4 is a cross-sectional view taken along IV-IV in FIG. 3.

First, FIGS. 1 to 4 show a printed substrate 10 serving as a first embodiment of the present invention, and a printed substrate with terminals 18 in which substrate terminals 14 are provided upright by first end portions 16 thereof being inserted into through-holes 12 of the printed substrate 10. Note that FIGS. 1 and 2 show a state before soldering, and FIGS. 3 and 4 show a state after soldering. Also, in the following description, the front side refers to the left side of FIG. 1, the rear side refers to the right side of FIG. 1, the upward direction refers to the upward direction of FIG. 1, and the downward direction refers to the downward direction of FIG. 1.

As shown in FIG. 3, the printed substrate 10 includes an insulated substrate 20 that is shaped as an approximately rectangular flat plate and is formed using a known insulating material such as a glass epoxy resin. The insulated substrate 20 has a laminated structure in which an inner layer 26 is interposed between a top layer 22a and a bottom layer 22b. An outer layer conductor pattern 24a serving as printed wiring is formed on the upper surface of the top layer 22a, and an outer layer conductor pattern 24b is formed on the lower surface of the bottom layer 22b. Inner layer conductor patterns 28a and 28b serving as printed wiring are provided on the upper surface and the lower surface of the inner layer 26 as well. Also, the majority of the outer surfaces of the outer layer conductor patterns 24a and 24b is covered by a protective coating 30 made of a synthetic resin for the purpose of oxidation prevention and the like, and the protective coating 30 has been removed from the outer layer conductor patterns 24a and 24b in the vicinity of the through-holes 12 such that the outer layer conductor patterns 24a and 24b are connected with a large area, that is to say with a low resistance, to the first end portions 16 of the substrate terminals 14 when flow soldering is performed.

As shown in FIGS. 1 to 4, the through-holes 12 of the printed substrate 10 are each configured by a clearance hole 32 that has a circular cross-sectional shape and four conduction regions 34 that are recessed grooves that bulge outward, in directions perpendicular to the axis, from the inner circumferential surface of the clearance hole 32 with an approximately hemispherical cross-sectional shape at positions that are separated from each other with a pitch of 90 degrees. The inner circumferential surface of the clearance hole 32 is scooped out by the four conduction regions 34, and the remaining portions of the inner circumferential surface configure four press-fitting regions 36 at positions that are separated from each other in the circumferential direction. Specifically, the press-fitting regions 36 are provided at four locations that are separated from each other in the circumferential direction of the through-hole 12, and the conduction regions 34 are respectively provided between pairs of press-fitting regions 36 that are adjacent in the circumferential direction. Furthermore, a plating layer 38 is adhered over the entirety of the interior of each of the through-holes 12. Also, the outer layer conductor patterns 24a and 24b and the inner layer conductor patterns 28a and 28b serving as printed wiring are connected to the portions of the plating layer 38 provided on the four conduction regions 34.

The substrate terminals 14 are provided upright by inserting the first end portions 16 thereof into the through-holes 12 of the printed substrate 10 configured as described above. As shown in FIGS. 1 to 4, the substrate terminals 14 are each an integrally molded article obtained by forming a substrate press-fitting portion 42 in a first end portion 16 of a bar-shaped metal fitting 40 and forming a connection portion 46 in a second end portion 44.

The bar-shaped metal fitting 40 is formed by cutting a metallic square wire member 48 to a predetermined length. A member that has rigidity to the extent that a spring property can be given by shape machining is preferably applied as the metallic square wire member 48, and as one example, the metallic square wire member 48 is a wire member that is formed from iron, a copper alloy such as tough pitch copper or brass, or the like, and that extends with a constant approximately square cross-sectional shape. Note that a plating layer is provided over the entirety of the outer surfaces around the metallic square wire member 48.

The substrate press-fitting portion 42 is formed in the first end portion 16 of the bar-shaped metal fitting 40 cut from the metallic square wire member 48. A diagonal dimension W of the substrate press-fitting portion 42 is larger than an inner diameter dimension R of the through-hole 12 (see FIG. 4). Note that a tip tapered portion 50 that has a tapered shape is formed on the tip edge portion of the substrate press-fitting portion 42, similarly to conventionally-used terminals.

Also, the bar-shaped metal fitting 40 is provided with a pair of approximately rectangular abutting portions 52, 52 on the central side (upper side in FIG. 1), with respect to the length direction (up-down direction in FIG. 1), of the substrate press-fitting portion 42. The pair of abutting portions 52, 52 are shaped as protrusions that protrude in the plate width direction (left-right direction in FIG. 2) of the bar-shaped metal fitting 40. The pair of abutting portions 52, 52 are formed by the two side edge portions of the metallic square wire member 48 being crushed in the plate thickness direction so as to protrude outward in the plate width direction. Note that although the abutting portions 52 of the present embodiment are shaped as protrusions that have an approximately rectangular cross-section, there are no limitations on the specific shape of the abutting portions 52, and an approximately triangular cross-sectional shape or the like is possible.

Also, a connection portion 46 is formed on the second end portion 44 side of the bar-shaped metal fitting 40. The connection portion 46 is given a desired cross-sectional shape by the two side edge portions of the metallic square wire member 48 on the second end portion 44 side being cut in the width direction, as necessary. Whereas the connection portion 46 has an approximately square cross-sectional shape in the present embodiment, a rear end tapered portion 54 that has a tapered shape is formed on the tip edge portion of the connection portion 46, similarly to conventionally-used terminals.

As shown in FIG. 1, the substrate press-fitting portion 42 side of the first end portions 16 of the substrate terminals 14 having the above-described structure are inserted into the through-holes 12 of the printed substrate 10. The insertion amount of the first end portion 16 of a substrate terminal 14 into a through-hole 12 is defined by the pair of abutting portions 52, 52 abutting against the printed substrate 10. In other words, due to the pair of abutting portions 52 abutting against the printed substrate 10, the first end portion 16 of the substrate terminal 14 is positioned in the axial direction of the through-hole 12. Note that when the first end portion 16 of the substrate terminal 14 is inserted into the through-hole 12 of the printed substrate 10, the first end portion 16 of the substrate terminal 14 is positioned such that the protruding direction of the pair of abutting portions 52 is the front-rear direction as shown in FIGS. 1 and 2. As shown in FIG. 4, due to the diagonal dimension W of the first end portion 16 (substrate press-fitting portion 42) of the substrate terminal 14 inserted into the through-hole 12 being set larger than the inner diameter dimension R of the through-hole 12, the first end portion 16 of the substrate terminal 14 is press-fitted into the press-fitting regions 36 of the through-hole 12 in a state where four corner portions 56 of the first end portion 16 of the substrate terminal 14 are pressure welded to corresponding press-fitting regions 36. Also, at this time, outer circumferential surfaces 58 of the first end portion 16 of the substrate terminal 14 are arranged so as to oppose the conduction regions 34 of the through-hole 12 via gaps 60 in directions perpendicular to the axis. By filling these gaps 60 with solder 62, the substrate terminal 14 is put into conduction with the plating layer 38 and the outer layer conductor patterns 24a and 24b and the inner layer conductor patterns 28a and 28b serving as printed wiring as shown in FIG. 3.

According to the printed substrate 10 having such a structure, the press-fitting regions 36 are provided at four locations that are separated from each other in the circumferential direction of the through-hole 12, and the conduction regions 34 are respectively provided between pairs of press-fitting regions 36 that are adjacent in the circumferential direction. For this reason, when the substrate terminal 14 is press-fitted into and fixed to the printed substrate 10, it is possible to avoid a situation in which pressing force exerted during press-fitting of the substrate terminal 14 is applied to the plating layer 38 and the outer layer conductor patterns 24a and 24b and inner layer conductor patterns 28a and 28b serving as printed wiring, which are provided on the conduction regions 34. Accordingly, deformation of such printed wiring (particularly the inner layer conductor patterns 28a and 28b) and detachment of the plating layer 38 can be prevented, thus making it possible to advantageously prevent the occurrence of measling and the occurrence of solder lifting defects caused by plating detachment in the step of soldering to the through-hole 12.

As a result, by merely press-fitting the first end portions 16 of the substrate terminals 14 into the through-holes 12 of the printed substrate 10 and performing soldering, the substrate terminals 14 can be positioned and held in an upright state on the printed substrate 10, thus making it possible to eliminate the need for a conventionally-needed base. For this reason, it is possible to reduce cost by reducing the number of components and the number of manufacturing steps, and, due to the need for a base being eliminated and the problem of solder crack formation is also eliminated, it is possible to also improve the connection reliability between the printed substrate 10 and the substrate terminals 14. Additionally, the pair of abutting portions 52 are provided as protrusions on the substrate terminals 14 that are to be provided upright on the printed substrate 10. These pairs of abutting portions 52 abut against the upper surface of the printed substrate 10, and therefore the substrate terminals 14 can be positioned in the axial direction of the through-holes 12, thus making it possible to further stably position and hold the substrate terminals 14 on the printed substrate 10.

Also, the press-fitting regions 36 are provided at four locations that are separated with an equal pitch in the circumferential direction, and therefore the corner portions 56 of an existing substrate terminal 14 have a square cross-section that can be press-fitted and held in a stable manner, thus making it possible to improve precision regarding substrate terminal 14 alignment and rolling. Furthermore, the conduction regions 34 are arranged so as to oppose the outer circumferential surfaces 58 of the substrate terminals 14 via the gaps 60 in directions perpendicular to the axis, thus making it possible to stably ensure insertion regions for the solder 62 when soldering the substrate terminals 14 to the through-holes 12, and making it possible to realize an improvement in a solder lifting property and a resulting improvement in connection stability. Moreover, in the present embodiment, the conduction regions 34 are formed so as to bulge outward in directions perpendicular to the axis relative to the press-fitting regions 36, thus making it possible to ensure large insertion regions for the solder 62 when soldering the substrate terminals 14 to the through-holes 12, and making it possible to realize a further improvement in a solder lifting property and an accompanying improvement in connection stability.

Figure 5:
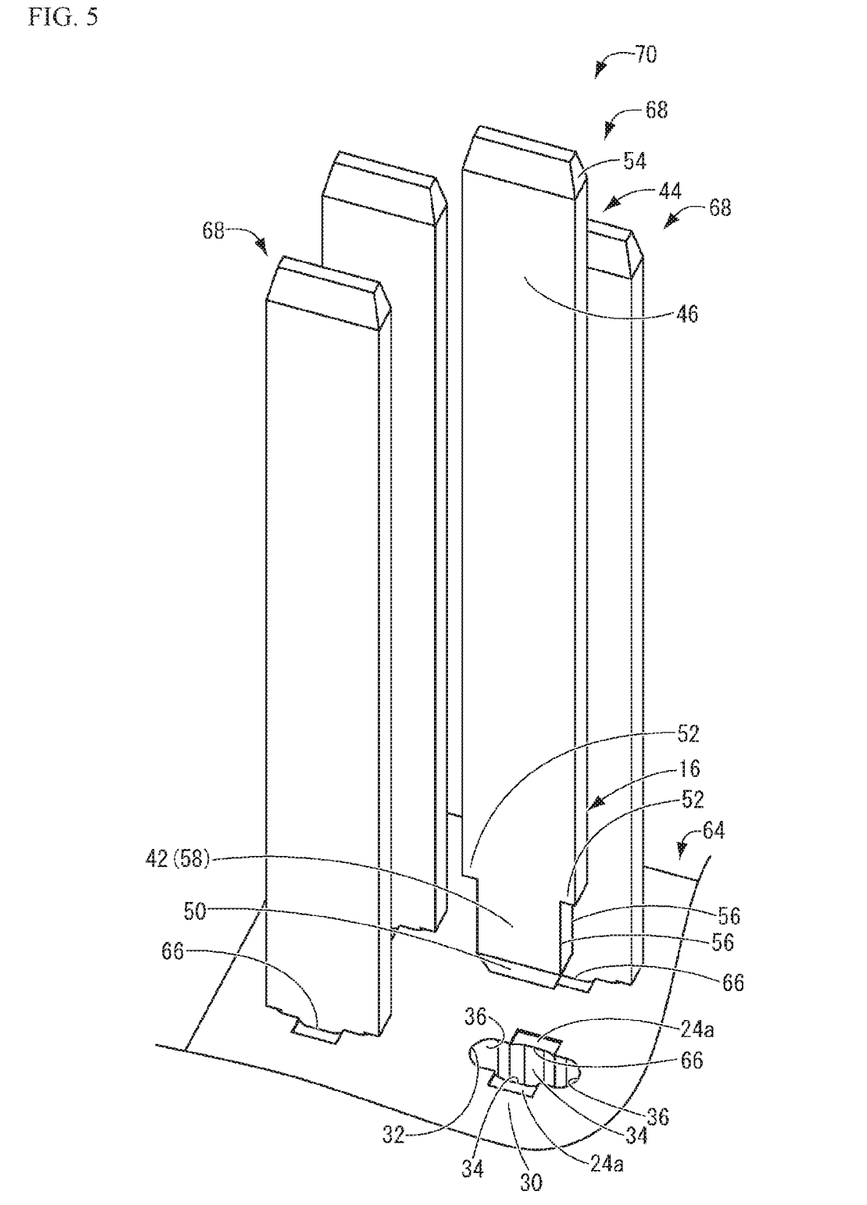
FIG. 5 is a perspective diagram showing a printed substrate serving as a second embodiment of the present invention, and a printed substrate with terminals in which substrate terminals are provided upright on the printed substrate.
Figure 6:
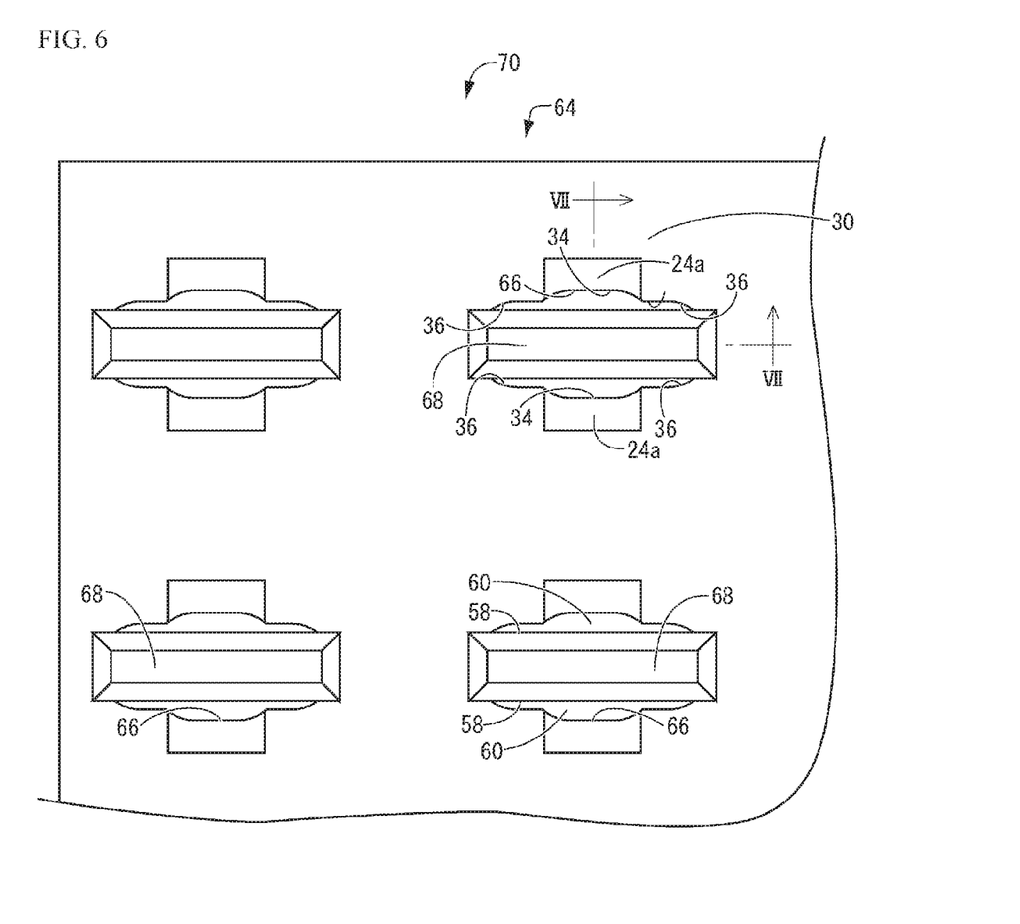
FIG. 6 is a plan view of the printed substrate with terminals shown in FIG. 5.
Figure 7:
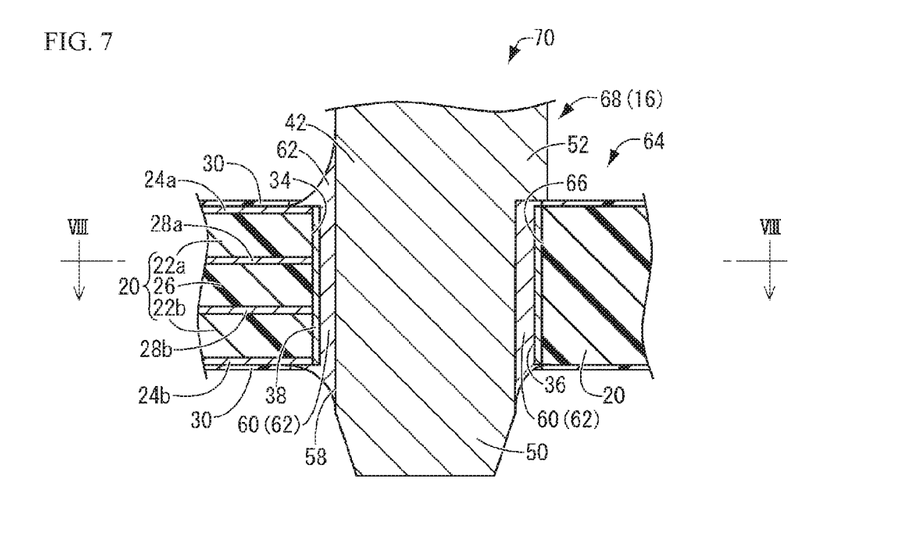
FIG. 7 is a cross-sectional view taken along VII-VII in FIG. 6.
Figure 8:
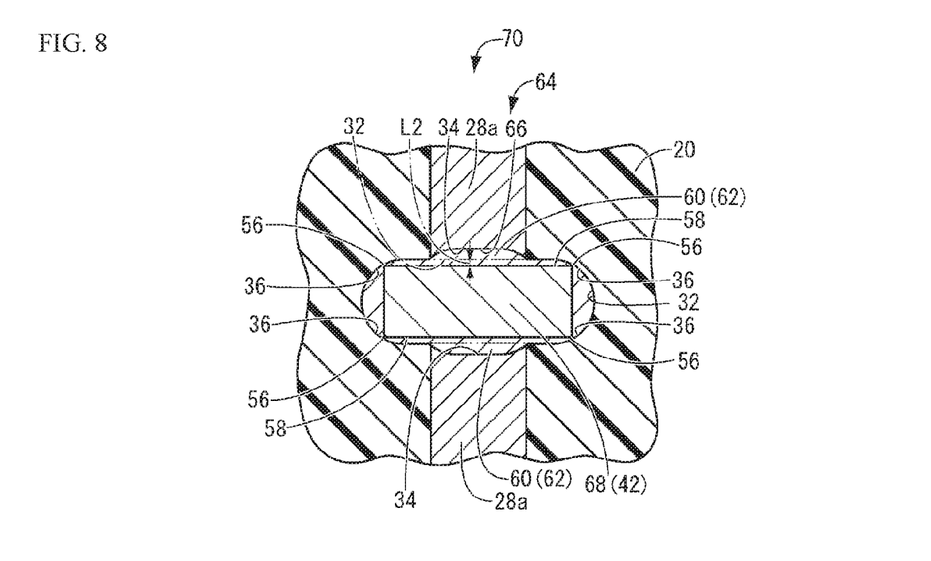
FIG. 8 is a cross-sectional view taken along VIII-VIII in FIG. 7.

Using FIGS. 5 to 8, the following describes details of a printed substrate 64 serving as a second embodiment of the present invention and a printed substrate with terminals 70 in which substrate terminals 68 are provided upright by first end portions 16 thereof being inserted into through-holes 66 of the printed substrate 64. Members and portions having structures similar to the above-described embodiment are denoted in the figures by the same reference signs as in the above-described embodiment, thereby omitting detailed descriptions for them. Note that FIGS. 5 and 6 show a state before soldering, and FIGS. 7 and 8 show a state after soldering. Specifically, in the printed substrate 64, the four press-fitting regions 36 are provided with different pitches in the circumferential direction of the through-hole 66, the conduction regions 34 are provided at two locations where the separation distance between adjacent press-fitting regions 36 is large (see FIG. 6), the first end portion 16 of the substrate terminal 14 has an approximately rectangular cross-sectional shape, and the four corner portions 56 are provided at locations that correspond to the four press-fitting regions 36. Accordingly, by the four corner portions 56 of an existing substrate terminal 68 having a rectangular cross-section being press-fitted into and pressure welded to the four press-fitting regions 36 of the through-hole 66 of the printed substrate 64, the substrate terminal 68 can be press-fitted into and held in the through-hole 66 in a stable manner.

Note that in the present embodiment as well, the structure of the through-hole 12 of the printed substrate 10 in the above embodiment is merely changed so as to conform to the cross-sectional shape of the first end portion 16 of the new substrate terminal 68, and therefore effects similar to the above embodiment can of course be obtained.

Figure 9:
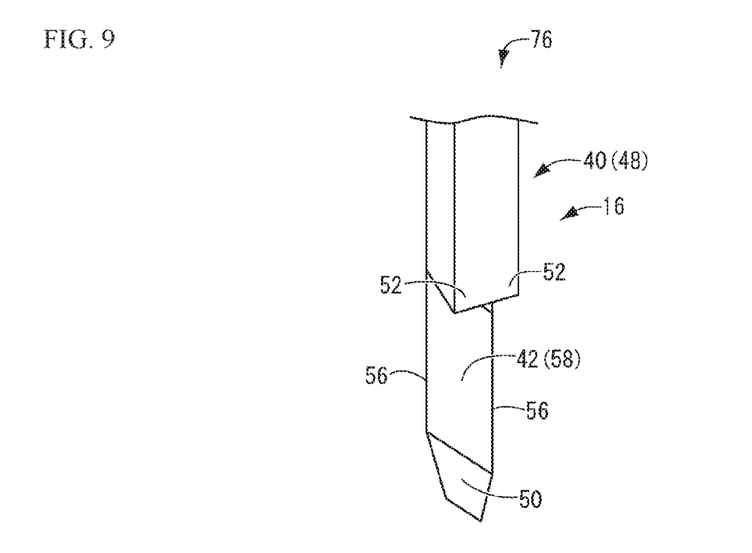
FIG. 9 is a perspective diagram showing a substrate terminal that is to be provided upright on a printed substrate serving as a third embodiment of the present invention.
Figure 10:
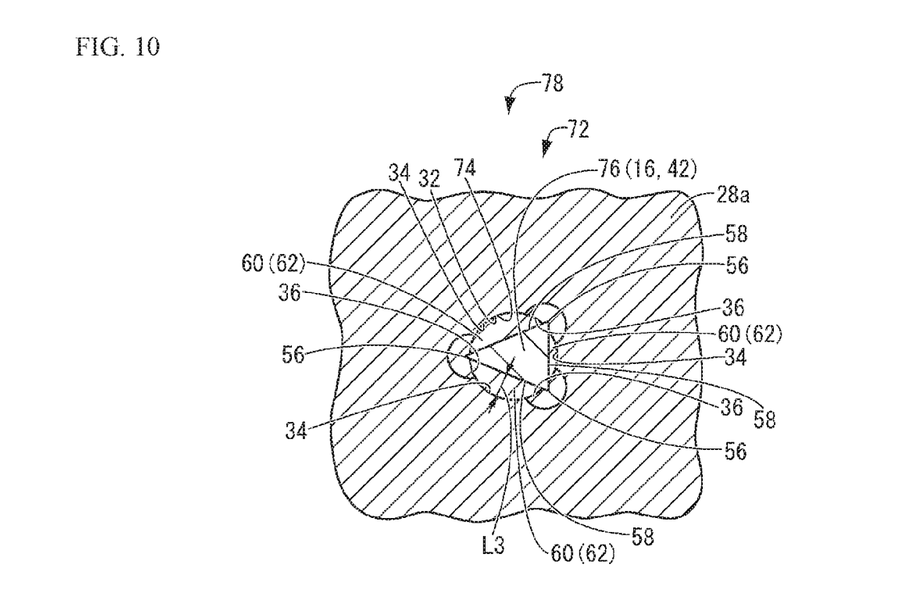
FIG. 10 is a cross-sectional view of a printed substrate with terminals on which the substrate terminal shown in FIG. 9 has been provided upright, and this figure corresponds to FIGS. 4 and 8.

Furthermore, using FIGS. 9 and 10, the following describes details of a printed substrate 72 serving as a third embodiment of the present invention and a printed substrate with terminals 78 in which substrate terminals 76 are provided upright by first end portions 16 thereof being inserted into through-holes 74 of the printed substrate 72. Members and portions having structures similar to the above-described embodiments are denoted in the figures by the same reference signs as in the above-described embodiments, thereby omitting detailed descriptions for them. Note that FIG. 10 shows a state after soldering. Specifically, in the printed substrate 72, the press-fitting regions 36 are provided at three locations that are separated from each other in the circumferential direction of the through-hole 74, and the conduction regions 34 are respectively provided between pairs of press-fitting regions 36 that are adjacent in the circumferential direction, but this embodiment is different from the first embodiment in that the first end portion 16 of the substrate terminal 76 has a triangular cross-sectional shape, and the three corner portions 56 of the first end portion 16 of the substrate terminal 76 are pressure welded to the press-fitting regions 36. Accordingly, the substrate terminal 76 can be stably press-fitted into and held in the through-hole 74, and it is possible to improve precision regarding substrate terminal 76 alignment and rolling. Moreover, due to the first end portion 16 of the substrate terminal 76 having a triangular cross-sectional shape, a dimension L3, in the direction perpendicular to the axis, of the gaps 60 between the conduction regions 34 of the through-hole 74 and the outer circumferential surfaces 58 of the first end portion 16 of the substrate terminal 76 that face the conduction regions 34 can be set larger than with a substrate terminal whose cross-sectional shape has four or more sides. In other words, it is possible to ensure a larger dimension L3 than the dimensions L1 and L2 of the gaps between the inner circumferential surfaces of the clearance hole 32 and the outer circumferential surfaces 58 of the first end portion 16 of the substrate terminals 14 and 68 in the first and second embodiments, for example. Accordingly, without causing the conduction regions 34 of the through-hole 74 to bulge outward in directions perpendicular to the axis, an improvement in the solder lifting property can be ensured even with the cross-sectional shape of the small through-hole 74 as in the present embodiment. Note that in the present embodiment as well, the structure of the through-hole 12 of the printed substrate 10 in the first embodiment is merely changed so as to conform to the cross-sectional shape of the first end portion 16 of the new substrate terminal 76, and therefore effects similar to the above embodiment can of course be obtained.

Although embodiments of the present invention have been described above, they are merely examples, and the present invention is not intended to be interpreted in a limiting manner, in any way, by the specific descriptions in the embodiments. For example, although the outer layer conductor patterns 24a and 24b and the inner layer conductor patterns 28a and 28b serving as printed wiring are all connected to the four conduction regions 34 in the above embodiments, it is sufficient that at least one printed wiring is connected. Also, although the first end portions 16 of the substrate terminals 14 are mounted to the through-holes 12 of the printed substrate 10 by flow soldering in the above embodiments, they may be mounted by reflow soldering. Note that lead-free solder not containing lead may be employed as the solder 62.

Additionally, although the conduction regions 34 of the through-holes 12 are configured so as to bulge outward in directions perpendicular to the axis in the first embodiment, the conduction regions 34 may be provided in the inner circumferential surface of the circular clearance hole 32 without bulging outward in directions perpendicular to the axis. Also, although the above embodiments have been described taking the example of the substrate terminals 14, 68, and 76 whose cross-sectional shapes are triangular, square, and rectangular, it goes without saying that the present invention can be applied to substrate terminals having any cross-sectional shape by providing a printed substrate with through-holes that are in accordance with the cross-sectional shape. Furthermore, although the plating layer 38 is adhered over the entirety of the interior of the through-holes 12 in the above embodiments, it is sufficient that the plating layer 38 is adhered to at least the conduction regions 34.

The invention claimed is:
1. A printed substrate comprising:
an inner wall bounding a space so as to define a through-hole having a generally uniform cross-section throughout an axial length of the through-hole, the through-hole configured to receive a first end portion of a substrate terminal,
the through-hole including a plurality of press-fitting regions into which the first end portion of the substrate terminal is press-fitted, and a plurality of conduction regions formed by a radial depression of the inner walls so as to define a plurality of gaps extending in a direction perpendicular to an axis of the through-hole, the plurality of conduction regions opposing and spaced apart from an outer circumferential surface of the first end portion of the substrate terminal; and
a printed wiring being connected to the plurality of conduction regions and a plating layer being adhered to the plurality of conduction regions.
2. The printed substrate according to claim 1, wherein the plurality of press-fitting regions are provided in at least three locations that are separated from each other in a circumferential direction of the through-hole, and the plurality of conduction regions are respectively provided between pairs of the plurality of press-fitting regions that are adjacent in the circumferential direction.
3. The printed substrate with terminals in which a substrate terminal is provided upright by a first end portion thereof being inserted into a through-hole of a printed substrate,
the printed substrate according to claim 1 being used as the printed substrate,
the first end portion of the substrate terminal being press-fitted into the plurality of press-fitting regions of the through-hole, and a corner portions of the first end portion being pressure welded to the plurality of press-fitting regions, and
the outer circumferential surfaces of the first end portion of the substrate terminal being arranged so as to oppose the plurality of conduction regions of the through-hole via the plurality of gaps in the directions perpendicular to the axis, and the substrate terminal and the printed wiring being put into conduction by filling the plurality of gaps with solder, wherein in the through-hole, the plurality of conduction regions protrude outward in the directions perpendicular to the axis relative to the press-fitting regions.

4. The printed substrate with terminals according to claim 3,
wherein the plurality of press-fitting regions are provided at three locations that are separated from each other in a circumferential direction of the through-hole, and the plurality of conduction regions are respectively provided between pairs of press-fitting regions that are adjacent in the circumferential direction, and
the first end portion of the substrate terminal has a triangular cross-sectional shape, and three corner portions of the first end portion of the substrate terminal are pressure welded to the press-fitting regions.

5. The printed substrate with terminals according to claim 3, wherein the substrate terminal is provided with an abutting portion that positions the first end portion in an axial direction of the through-hole by abutting against the printed substrate.

6. A printed substrate with terminals in which a substrate terminal is provided upright by a first end portion thereof being inserted into a through-hole of a printed substrate, the printed substrate according to claim 2 being used as the printed substrate,
the first end portion of the substrate terminal being press-fitted into the plurality of press-fitting regions of the through-hole, and a corner portion of the first end portion being pressure welded to the plurality of press-fitting regions, and
the outer circumferential surfaces of the first end portion of the substrate terminal being arranged so as to oppose the plurality of conduction regions of the through-hole via the plurality of gaps in the direction perpendicular to the axis, and the substrate terminal and the printed wiring being put into conduction by filling the plurality of gaps with solder,
wherein in the through-hole, the plurality of conduction regions protrude outward in the directions perpendicular to the axis relative to the press-fitting regions.

7. The printed substrate with terminals according to claim 4, wherein the substrate terminal is provided with an abutting portion that positions the first end portion in an axial direction of the through-hole by abutting against the printed substrate.

* * * * *